US011997226B2

(12) United States Patent
Wang et al.

(10) Patent No.: US 11,997,226 B2
(45) Date of Patent: May 28, 2024

(54) COVER PLATE, DISPLAY PANEL, AND DISPLAY TERMINAL

(71) Applicant: YUNGU (GU'AN) TECHNOLOGY CO., LTD., Langfang (CN)

(72) Inventors: Liuyang Wang, Langfang (CN); Qi Shan, Langfang (CN); Liwei Ding, Langfang (CN); Fu Liao, Langfang (CN); Yuhua Wu, Langfang (CN); Hongqi Hou, Langfang (CN); Jun Wang, Langfang (CN)

(73) Assignee: YUNGU (GU'AN) TECHNOLOGY CO., LTD., Kangfang (CN)

( * ) Notice: Subject to any disclaimer, the term of this patent is extended or adjusted under 35 U.S.C. 154(b) by 254 days.

(21) Appl. No.: 17/668,374

(22) Filed: Feb. 9, 2022

(65) Prior Publication Data

US 2022/0272186 A1    Aug. 25, 2022

Related U.S. Application Data

(63) Continuation of application No. PCT/CN2020/134341, filed on Dec. 7, 2020.

(30) Foreign Application Priority Data

Feb. 24, 2020 (CN) .......................... 202010112092.8

(51) Int. Cl.
*H05K 5/00* (2006.01)
*H04M 1/02* (2006.01)
*H05K 5/03* (2006.01)

(52) U.S. Cl.
CPC ........ *H04M 1/0269* (2022.02); *H05K 5/0017* (2013.01); *H05K 5/03* (2013.01)

(58) Field of Classification Search
None
See application file for complete search history.

(56) References Cited

U.S. PATENT DOCUMENTS 9,342,105 B2    5/2016  Choi et al.
9,537,526 B2 *  1/2017  Wilson ................. H04B 1/3888
(Continued)

FOREIGN PATENT DOCUMENTS

CN    108766977 A    11/2018
CN    208112692 U    11/2018
(Continued)

OTHER PUBLICATIONS

International Search Report and Written Opinion (International Application No. PCT/CN2020/134341) with English Translation, dated Mar. 9, 2021, 12 pages.

(Continued)

*Primary Examiner* — Anthony Q Edwards
*Assistant Examiner* — Rashen E Morrison
(74) *Attorney, Agent, or Firm* — Quarles & Brady LLP

(57) ABSTRACT

The present disclosure relates to a cover plate, a display panel and a display terminal. The cover plate includes a first region and a second region surrounding the first region. The second region includes a plurality of side cover plate regions and at least one corner opening region located between two adjacent side cover plate regions. The cover plate includes at least one buffer portion which is filled in the corner opening region.

20 Claims, 4 Drawing Sheets

(56) References Cited

U.S. PATENT DOCUMENTS

| | | | |
|---|---|---|---|
| 9,791,893 B2* | 10/2017 | Yamaguchi | G06F 1/1656 |
| 10,148,000 B2* | 12/2018 | Hill | H04M 1/0283 |
| 11,439,029 B2* | 9/2022 | Park | H04M 1/0283 |
| 11,769,940 B2* | 9/2023 | Renda | H01Q 13/10 |
| | | | 343/702 |
| 2012/0314354 A1* | 12/2012 | Rayner | G06F 1/1633 |
| | | | 361/679.01 |
| 2014/0253477 A1* | 9/2014 | Shim | G06F 3/0487 |
| | | | 345/173 |
| 2015/0341072 A1* | 11/2015 | Lai | H04B 1/3888 |
| | | | 455/575.8 |
| 2017/0069956 A1* | 3/2017 | Hill | H04M 1/0249 |
| 2020/0176696 A1 | 6/2020 | Dai | |
| 2021/0291493 A1 | 9/2021 | Kim et al. | |

FOREIGN PATENT DOCUMENTS

| | | |
|---|---|---|
| CN | 109671358 A | 4/2019 |
| CN | 209000412 U | 6/2019 |
| CN | 110205042 A | 9/2019 |
| CN | 110225159 A | 9/2019 |
| CN | 111315173 A | 6/2020 |
| JP | 2015072380 A | 4/2015 |
| WO | 2018034428 A1 | 2/2018 |

OTHER PUBLICATIONS

Chinese First Office Action 100191 (CN Application No. CN 202010112092.8) and Search Report with English Translation, dated Sep. 25, 2020, 12 pages.

Chinese Second Office Action 100191 (CN Application No. CN 202010112092.8) with English Translation, dated Apr. 26, 2021, 7 pages.

Chinese Rejection Decision 100191 (CN Application No. CN 202010112092.8) with English Translation, dated Oct. 8, 2021, 13 pages.

* cited by examiner

COVER PLATE, DISPLAY PANEL, AND DISPLAY TERMINAL

CROSS-REFERENCE TO RELATED APPLICATION

This application is a continuation under 35 U.S.C. § 111 of international patent application No. PCT/CN2020/134341, filed on Dec. 7, 2020, entitled "COVER PLATE, DISPLAY PANEL, AND DISPLAY TERMINAL", which claims the benefit of Chinese Application No.: CN 202010112092.8, filed Feb. 24, 2020, entitled "COVER PLATE, DISPLAY PANEL, AND DISPLAY TERMINAL" the contents of which are commonly owned and hereby incorporated by reference in their entirety.

TECHNICAL FIELD

The present disclosure relates to the field of display technology.

BACKGROUND

Since organic light emitting diodes (OLEDs) have self-emitting characteristics, there is no need to use a separate light source. As a result, an OLED display device can be designed to be thinner and lighter, thereby gaining a favor of the industry.

As a demand for the display device gradually increases, a display area of the display device may be further increased by attaching a three-dimensional (3D) cover plate having a multi-curved surface (or 3D curved surface cover) to a flexible OLED display substrate based on a bendable characteristic of the OLED display substrate. However, if the display device falls down, corners of the display panel are easily impacted and damaged.

SUMMARY

Exemplary embodiments of the present disclosure provide a cover plate, a display panel, and a display terminal to prevent corners of the multi-curved screen from being impacted and damaged.

An aspect of the present disclosure provides a cover plate including a first region; a second region surrounding the first region, the second region including a plurality of side cover plate regions and at least one corner opening region located between two adjacent side cover plate regions; and at least one buffer portion filled in the corner opening region.

A display panel is formed by the cover plate and a display substrate which is attached to an inner surface of the cover plate. The display substrate may be attached to the same side of the cover plate corresponding to the first region and the plurality of side cover plate regions, thereby forming a full-curved cover plate which can emit light from both a front surface and a side surface. Taking a mobile phone as an example, a full-curved screen mobile phone can be formed, in which the display can be realized on all four side surfaces of the display panel, thereby effectively increasing a display area. In addition, the corner opening region is defined at the corner where two adjacent side cover plate regions intersect, and the buffer portions are filled in the corner opening regions. That is, the flexible buffer portions are provided at the corners of the display panel. When the corner of the display panel is impacted, the buffer portion can absorb the stress when being impacted, preventing the display panel from being damaged, and improve the service life of the display panel.

Another aspect of the present disclosure provides a display panel including: a display substrate; and the cover plate provided by the exemplary embodiments of the present disclosure. The display substrate is attached to the cover plate corresponding to the first region and the plurality of side cover plate regions.

Yet another aspect of the present disclosure provides a display terminal including: a middle frame; and the display panel provided by the exemplary embodiments of the present disclosure. The display panel is disposed on the middle frame, and the display panel includes the cover plate provided by the exemplary embodiments of the present disclosure.

DETAILED DESCRIPTION OF THE EMBODIMENTS

Figure 1:
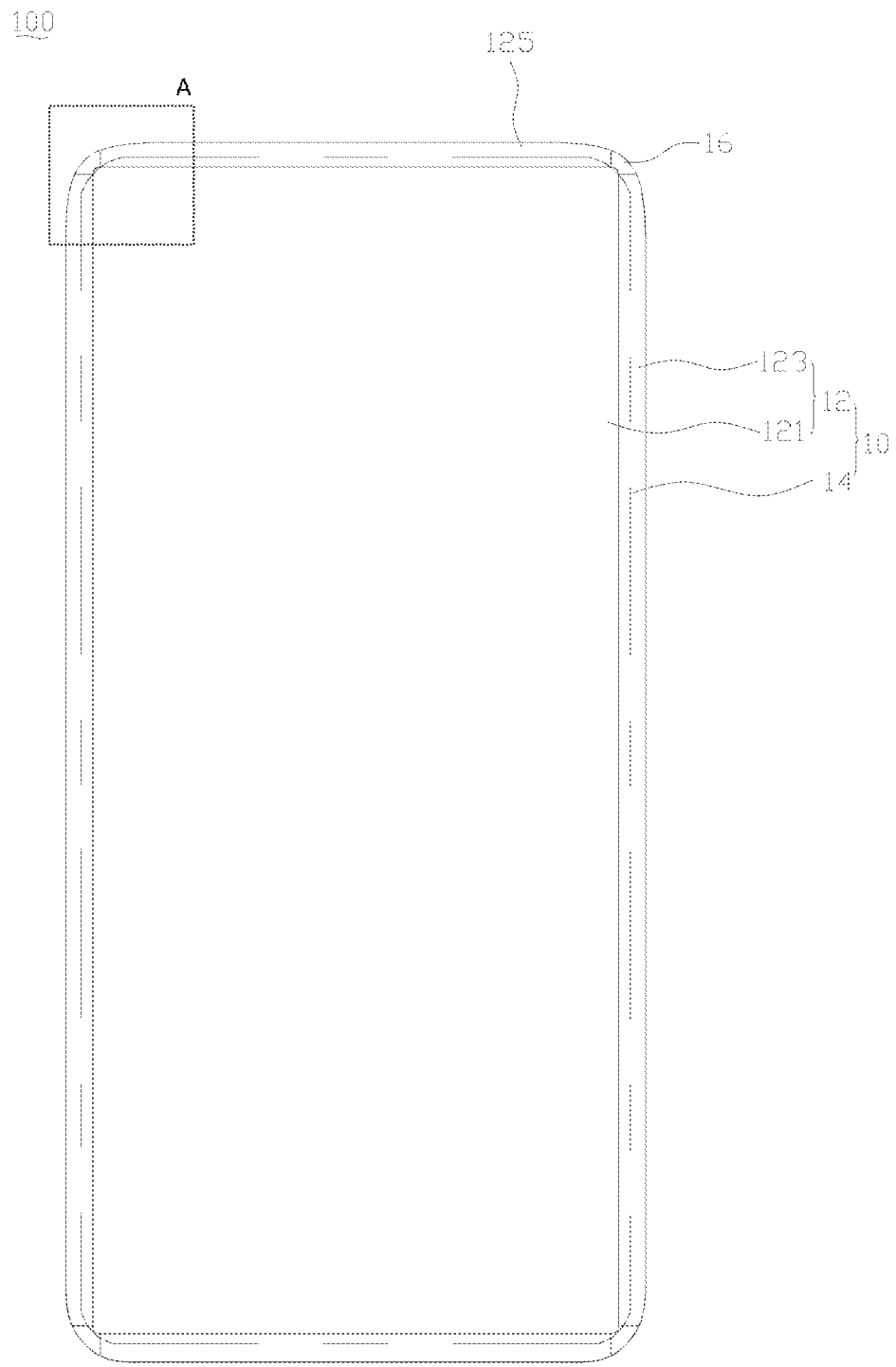
FIG. 1 is a front view of a display terminal according to an embodiment of the present disclosure.
Figure 2:
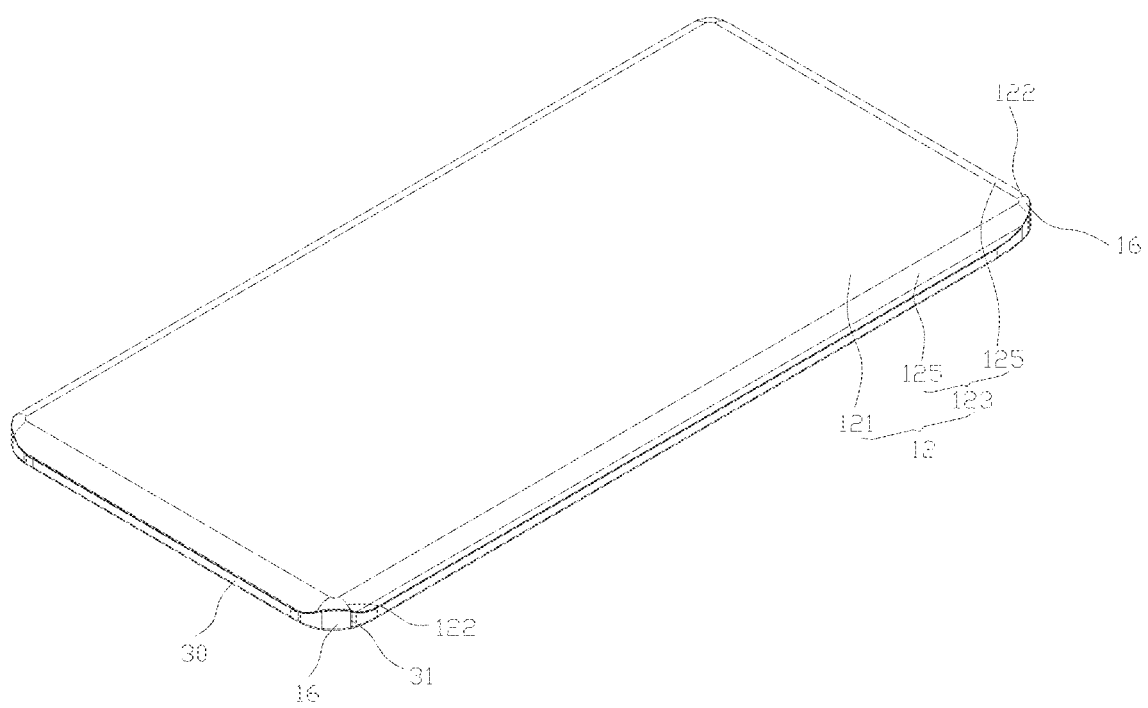
FIG. 2 is a perspective view of the display terminal shown in FIG. 1.

In order to facilitate the understanding of the present disclosure, the present disclosure will be described in a more comprehensive manner with reference to the relevant drawings. Exemplary embodiments of the present disclosure are shown in the drawings. However, the present disclosure can be implemented in many different forms and is not limited to the embodiments described herein. To the contrary, the purpose of providing these embodiments is to make the disclosure of the present disclosure more thorough and comprehensive.

One or more embodiments of the present disclosure will be described in detail with reference to the accompanying drawings, in which elements such as shapes, sizes, scales, angles, and numbers of components are merely examples. In different embodiments, the same or corresponding elements may be indicated by the same reference numerals, and the repeated description thereof is omitted.

Unless otherwise defined, all technical and scientific terms used herein have the same meaning as commonly understood by those skilled in the technical field of the present disclosure. The terms used in the description of the present disclosure are merely for the purpose of describing specific embodiments, and are not intended to limit the present disclosure. The term "and/or" used herein includes any and all combinations of one or more related listed items.

In the present disclosure, the use of ordinal terms such as "first," "second," etc. to modify elements does not indicate any priority, ranking, or order of one element relative to another element, or a chronological order of the actions in performing the method. Unless specifically stated otherwise, such ordinal numbers are only used as labels to distinguish one element with a specific name from another element with the same name (except for the ordinal number). For example, the "first region" may be named so as to only distinguish it from, for example, the "second region." The mere use of the ordinal numbers "first" and "second" before the term "region" does not indicate any other relationship between the two regions, nor does it likewise indicate any other characteristics of either or both regions.

As described above, the emergence of OLED display technology provides a basis for the implementation of a full screen. An OLED display panel formed of a 3D curved cover plate having radians on a plurality of side edges and a flexible OLED display substrate further increases the display area. As such, it has a more exceptional visual effect, which improves the user's use experience, and is a major trend in the current development of electronic equipment. However, the inventors of the present disclosure have found that, when the display terminal falls down, a corner of the display terminal is frequently and easily in contact with the ground and subjected to an impact force firstly. This results in damage to the corner of the display panel. Further, since the flexible OLED display substrate is in a rectangular shape when it is unfolded, when the flexible OLED display substrate is attached to an inside of the 3D curved cover plate having radians on the edges, the OLED display substrate is bent at the corner, due to the OLED display substrate is squeezed, wrinkles and/or air bubbles are generated, which further causes defects such as display deterioration at the corner of the OLED display panel.

The exemplary embodiments disclosed herein provide a display panel that can improve the above problems.

Figure 4:
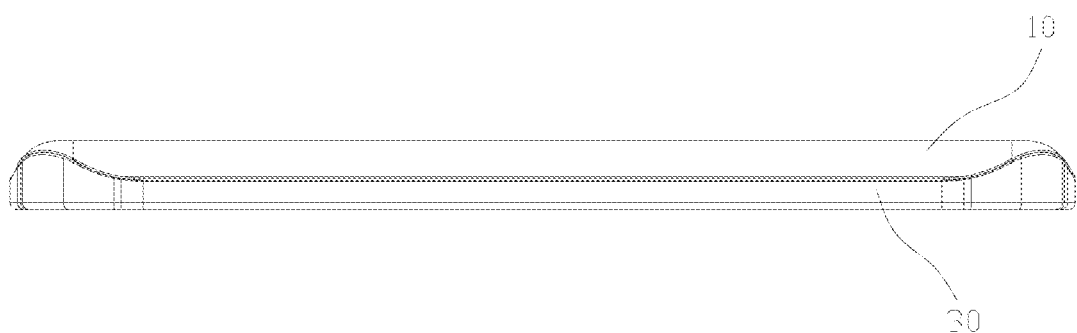
FIG. 4 is a bottom view of the display terminal shown in FIG. 1.

Referring to FIGS. 1 and 4, in one embodiment, a display panel 10 includes a cover plate 12 and a display substrate 14. The display substrate 14 is attached to an inner surface of the cover plate 12 by an adhesive layer. Specifically, the adhesive layer may be an optically clear adhesive (OCA) layer. The cover plate 12 is used to protect the display substrate 14 from external impacts. The display substrate 14 has a display function on a front surface and a side surface of the cover plate 12, thereby realizing curved surface display. The cover plate 12 covers the front surface (i.e., a light-emitting surface) of the display substrate 14, and has a better light transmittance. For example, the cover plate 12 may be made of sapphire glass, gorilla glass, or the like. Preferably, the material of the cover plate 12 may include at least one of polyethylene terephthalate, polycarbonate, polyether sulfone, polyethylene naphthalate, and polynorbornene.

The display substrate 14 may include an array board and a display layer group formed on the array board. The array board is used to input a driving current to the display layer group to control the light emission of the display layer group. The display layer group includes a plurality of organic light emitting units provided at intervals and insulated from each other. Each of the organic light emitting units includes an anode, a cathode and an organic light emitting layer disposed between the anode and the cathode. When the array board inputs the driving current to the display layer group, electron injected from the cathode and electron hole injected from the anode are combined with each other in the organic light emitting layer of the organic light emitting unit to form an exciton. The exciton emits light when it releases energy. Finally, different colors are displayed by the emission of light of different wavelengths.

In this embodiment, the cover plate 12 includes a first region 121 and a second region 123 surrounding the first region 121. The second region 123 includes a plurality of side cover plate regions 125 and a plurality of corner opening regions 122, each of the plurality of corner opening regions 122 is located between two adjacent side cover plate regions 125. In other words, the corner opening region 122 is defined at a corner where the two adjacent side cover plate regions 125 of the plurality of side cover plate regions 125 intersect. Each of the side cover plate regions 125 is connected to one side of the first region 121. The plurality of side cover plate regions 125 are connected with a plurality of sides of the first region 121 in one-to-one correspondence. Each of the corner opening regions 122 is connected to one corner of the first region 121. A plurality of corner opening regions 122 are connected with a plurality of corners of the first region 121 in one-to-one correspondence. The portion of the cover plate 12 corresponding to an entire first region 121 and the side cover plate regions 125 of the second region 123 are solid parts of the cover plate 12. The corner opening region 122 is a space defined by the solid parts of the cover plate 12, in particular the portion of the cover plate 12 corresponding to two adjacent side cover plate regions 125. The cover plate 12 further includes a buffer portion 16. The buffer portion 16 is filled in the corner opening region 122. That is, the buffer portion 16 is filled in the corner of the display panel 10 to prevent the corner of the display panel 10 from being damaged after being impacted, thereby improving the service life of the display panel 10. Further, the display substrate 14 is disposed on the same side of the cover plate corresponding to the first region 121 and the plurality of side cover plate regions 125 for light-emitting display while being protected by the cover plate 12.

It is understandable that the term "fill" herein refers to disposing the buffer portion 16 in the corner opening region 122, and fixing the buffer portion 16 in the corner opening region 122 by a fastening technique. For the fastening techniques, the present disclosure will be further described in the following embodiments.

Optionally, the first region 121 is a flat region and the second region 123 is a curved region. In an embodiment, the flat region 121 is flat and a cross section of the cover plate corresponding to the curved region is shaped as an arc. The curved region is located on at least one side of the flat region, and a transition between the curved region and the flat region is smooth. The display region of the display substrate 14 includes a front display region and a side display region. The curved region of the cover plate 12 may define a contour of the side display region of the display region of the display substrate 14. That is, the display substrate 14 is attached to the cover plate 12 corresponding to the curved region, and the display of the side surface of the display panel 10 can be realized by allowing the light emitted from the display substrate 14 to pass through the curved region which is light-transmitting, thereby increasing the display area.

Optionally, the buffer portion 16 is a silicone member to have better flexibility. The buffer portion 16 may be bonded to an inner wall of the corner opening region 122 by a bonding layer.

In the above-described display panel 10, the display substrate 14 attached to the cover plate 12 emits light, and the display substrate 14 is attached to the same side of the cover plate 12 of the first region 121 and the plurality of side cover plate regions 125, so that both the front surface and the side surface of the display panel 10 can emit light, thereby forming a full-curved display panel. Taking a mobile phone as an example, a full-curved screen mobile phone can be formed, in which light-emitting display can be realized on all four side surfaces of the display panel 10, thereby effectively increasing the display area. In addition, the corner opening regions 122 are defined at the corners where two adjacent side cover plate regions 125 intersect, and the buffer portions 16 are filled in the corner opening regions 122. That is, the flexible buffer portions 16 are provided at the corners of the display panel 10. When the corner of the display panel is impacted, the buffer portion 16 can absorb the stress when being impacted, and thus prevent the display panel 10 from being damaged, and improve the service life of the display panel 10.

Figure 3:
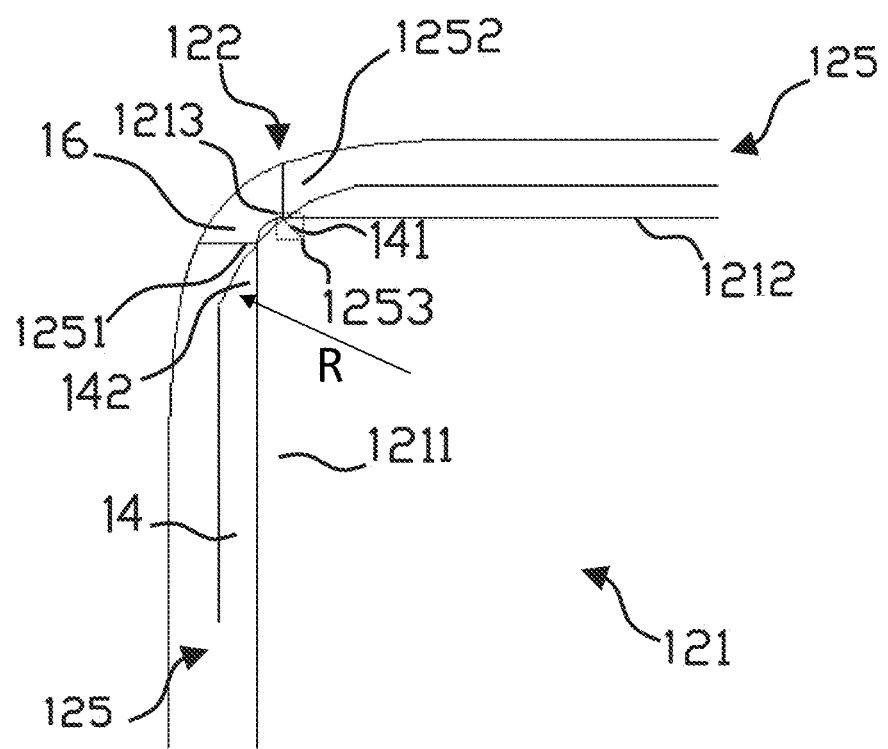
FIG. 3 is a partially enlarged view of a block A in FIG. 1.

Referring to FIG. 3, FIG. 3 shows a partially enlarged view of a block A in FIG. 1. In the present embodiment, an intersection of two adjacent virtual side surfaces 1211, 1212 of the first region 121 forms a first virtual intersection line. An orthographic projection of the first virtual intersection line on a first plane parallel to the first region 121 is a first intersection point 1213. The two side cover plate regions 125 corresponding to the first intersection point 1213 respectively include two adjacent virtual side end surfaces 1251, 1252. The corner opening region 122 is a region formed between two adjacent virtual side end surfaces 1251, 1252. An orthogonal projection of a second virtual intersection line on the first plane is a second intersection point 1253, the second virtual intersection line is formed by an intersection of two planes where the two adjacent virtual side end surfaces 1251, 1252 are located, respectively. In this embodiment, the second intersection point 1253 is located in the first region 121. Preferably, the second intersection point 1253 may also coincide with the first intersection point 1213, or the second intersection point 1253 may located on a side of the first intersection point 1213 away from the first region 121. That is, the second intersection point 1253 corresponding to the two virtual side end surfaces 1251, 1252 coincides with the first intersection point 1213, or is located outside of the first region 121. Thus, the positions of the virtual side end surfaces 1251, 1252 are restricted as above, and an area of the corner opening region 122 formed between the two adjacent virtual side end surfaces 1251, 1252 is reduced. In this way, a structure of the cover plate 12 corresponding to the first region 121 is prevented from being affected by an oversized area of the corner opening region 122, and it is ensured that the cover plate 12 corresponding to the first region 121 can completely cover and attach the display substrate 14 corresponding to a first display region, the display substrate 14 corresponding to a first display region is located below the cover plate 12 corresponding to the first region 121, so as to protect the display substrate 14 corresponding to the first display region. The first display region of the display substrate 14 will be described in detail below.

Further, a range of an angle between the two adjacent side end surfaces 1251, 1252 is greater than 0° and less than or equal to 90°. That is, an opening angle of the corner opening region 122 formed by the two adjacent side end surfaces is greater than 0° and less than or equal to 90°. In this way, the angle of the corner opening region 122 is prevented from being too large to affect a shape of the cover plate 12 corresponding to the side cover plate region 125, thereby ensuring that the cover plate 12 corresponding to the side cover plate region 125 can completely cover and attach to the display substrate 14 corresponding to the side display region, so as to protect the display substrate 14 corresponding to the side display region. The side display region of the display substrate 14 will be described in detail below.

In the present embodiment, the display substrate 14 includes the first display region (i.e., the above-described front display region) and a second display region, the second display region includes a plurality of side display regions. When the display substrate 14 is attached to the cover plate 12, the first display region corresponds to the first region 121, and the side display regions respectively correspond to the side cover plate regions 125. In this way, the first region 121 and the side cover plate regions 125 can realize a light-emitting display, which increases the display area.

Further, a spacing region corresponding to the corner opening region 122 may be located between the two adjacent side display regions of the display substrate 14, the display substrate 14 corresponding to the two adjacent side display regions is attached to the cover plate 12 corresponding to the second region, so that the display substrate 14 does not extend into the corner opening region 122 after attaching to the cover plate 12. That is, the display substrate 14 does not interfere with the buffer portion 16 which is filled in the corner opening region 122. The above spacing region is defined by two adjacent virtual side surfaces of two adjacent side display regions of the display substrate 14.

Optionally, continuing to refer to FIG. 3, an intersection of two adjacent virtual side surfaces 1211, 1212 of the first region 121 forms a first virtual intersection line. An orthographic projection of the first virtual intersection line on the first plane parallel to the first region 121 is a first intersection point 1213. The display substrate 14 has round corners 142. A contour line of the round corner 142 extends from one of the two adjacent side display regions to the other one of the two adjacent side display regions. An intersection point of the contour line of the round corner 142 and a connecting line between the first intersection point 1213 and the second intersection point 1253 is a third intersection point 141, the round corner 142 is located between the two side display regions corresponding to the first intersection point 1213. Preferably, the third intersection point 141 coincides with the first intersection point 1213. The third intersection point 141 is a corner point of the first display region. When the corner point 141 of the first display region coincides with the first intersection point 1213, the display substrate 14 corresponding to the first display region can be accurately attached to the cover plate corresponding to the first region 121, so that the display substrate 14 corresponding to the side display region can be more accurately attached to the cover plate corresponding to the side cover plate regions 125, and the position of the first display region corresponding to the first region 121 and the position of the second display region corresponding to the second region 123 can be prevented from being shifted, thereby ensuring the accuracy of the attaching positions.

Specifically, the display substrate 14 is a flexible substrate. Each corner of the display substrate 14 is set to a round corner 142 having a large radius, for example, a large R-angle design. The display substrate 14 includes the first display region and the plurality of side display regions surrounding an outer periphery of the first display region. When the display substrate 14 is attached to the cover plate 12, the display substrate 14 corresponding to the first display region is attached to the inner surface of the cover plate 12 corresponding to the first region 121, and then the display substrate 14 corresponding to the plurality of side display regions is bent to attach to the cover plate 12 corresponding to the side cover plate regions 125. Since the corner of the display substrate 14 is a large round corner, the edges of the two adjacent ends of the display substrate 14 corresponding to the two adjacent side display regions after being bent are all shaped as an arc, and extend away from each other in a direction away from the plane where the first region 121 is located. A spacing region covering the corner opening region 122 of the cover plate 12 may be formed between two adjacent side display regions, so that the display substrate 14 corresponding to the side display region does not extend into the corner opening region 122 of the cover plate 12 after being bent. Thus, the display substrate 14 and the corner opening region 122 do not interfere with each other. It is understandable that the display substrate 14 may be implemented in other ways as long as it is possible to ensure that a spacing region is located between two adjacent side display regions after the display substrate 14 corresponding to the second display region is bent, which is not limited herein.

Preferably, as shown in FIG. 4, a display terminal 100 is further provided, which includes a middle frame 30 and the display panel 10 according to various embodiments of the present disclosure. A receiving chamber for receiving accessories of the display terminal 100 is formed between the display panel 10 and the middle frame 30. The display terminal 100 may be a mobile communication terminal having a display function and a communication function, such as a mobile phone. It is understandable that, in other embodiments, the display terminal 100 may also be other intelligent devices having the display function and the communication function, such as tablet computers, in-vehicle devices, or wearable devices, which is not limited herein.

As it can be seen from the above description, the display panel 10 is a full-curved display screen, and the front surface and all side surfaces thereof can be used for display. The corner at which two adjacent side surfaces of the display panel 10 intersect is easily impacted due to the protruding design of the corner. Therefore, the corner opening region 122 is defined and the buffer portion 16 is filled in the corner opening region 122, so that when a corner of the display panel 10 is impacted, the force-receiving point is located in the buffer portion 16, so as to prevent the cover plate 12 from being damaged while being impacted, thereby protecting the display panel 10.

Preferably, the buffer portion 16 is protruded from a surface of the middle frame 30 facing to the cover plate 12. When the display panel 10 is disposed on the middle frame 30, the buffer portion 16 may be embedded into the corner opening region 122 of the corner of the cover plate 12. It is understandable that, the buffer portion 16 may be formed separately from the middle frame 30, or may be integrally formed with the middle frame 30. When the buffer portion 16 and the middle frame 30 are separately formed, the buffer portion 16 is embedded in the corner opening region 122 and abuts against the middle frame 30 in a sealing way. In this manner, the display panel 10 is formed by mounting the buffer portion 16 on the cover plate 12, and then the display panel 10 is disposed on the middle frame 30 to form the display terminal 100.

Further, a notch 31 communicating with the corner opening region 122 is formed at the corner of the middle frame 30. The corner opening region 122 and the notch 31 are filled with the buffer portion 16 to increase a volume of the buffer portion 16. In this way, the buffer portion 16 is filled not only in the corner of the cover plate 12, but also in the corner of the middle frame 30, so that the buffer portion 16 is filled in a large area of the corner of the display terminal 100 at the outer periphery, thereby further improving the effect of absorbing the impact force of the buffer portion 16 and protecting the display terminal 100.

Further, the buffer portion 16 may be bonded to the inner wall of the corner opening region 122 and/or the notch 31 by at least one bonding layer, so as to connect the buffer portion 16 to the cover plate 12 and/or the middle frame 30 by the at least one bonding layer. It is understandable that, the display terminal 100 may further include fasteners, the buffer portion 16 is connected to the middle frame 30 through at least one fastener, for example, the buffer portion 16 is connected to the middle frame 30 by the at least one fastener such as screw, so that the buffer portion 16 is fixed in the corner opening region 122 and the notch 31.

The technical features of the above described embodiments can be combined arbitrarily. To simplify the description, not all possible combinations of the technical features in the above embodiments are described. However, all of the combinations of these technical features should be considered as within the scope of the present disclosure, as long as such combinations do not contradict with each other.

The foregoing embodiments are merely some embodiments of the present disclosure, and descriptions thereof are relatively specific and detailed. However, it should not be understood as a limitation to the patent scope of the present disclosure. It should be noted that, a person of ordinary skill in the art may further make some variations and improvements without departing from the concept of the present disclosure, and the variations and improvements falls in the protection scope of the present disclosure. Therefore, the protection scope of the present disclosure shall be subject to the appended claims.

What is claimed is:

1. A cover plate comprising:
    a first region;
    a second region surrounding the first region, the second region comprising:
        a plurality of side cover plate regions; and
        at least one corner opening region located between two adjacent side cover plate regions; and
    at least one buffer portion, wherein the buffer portion is filled in the corner opening region;
    wherein a first virtual intersection line formed by an intersection of two adjacent virtual side surfaces of the first region is perpendicular to a first plane parallel to the first region, and an orthographic projection of the first virtual intersection line on the first plane parallel to the first region is a first intersection point two side cover plate regions corresponding to the first intersection point comprise two adjacent virtual side end surfaces respectively, the corner opening region is a region located between the two adjacent virtual side end surfaces, and a second virtual intersection line is perpendicular to the first plane, and an orthographic projection of the second virtual intersection line on the first plane is a second intersection point, the second virtual intersection line is formed by an intersection of two planes where the two adjacent virtual side end surfaces are located respectively; and
    wherein the second intersection point coincides with the first intersection point, or the second intersection point is located on a side of the first intersection point away from the first region.

2. The cover plate according to claim 1, wherein the first region is a flat region, the second region is a curved region, the curved region is located at an edge of the flat region, and the curved region extends from the flat region.

3. The cover plate according to claim 1, wherein a range of an angle between the two adjacent virtual side end surfaces is greater than 0° and less than or equal to 90°.

4. The cover plate according to claim 1, wherein the buffer portion is a silicone member.

5. A display panel, comprising:
    a display substrate; and
    the cover plate according to claim 1, wherein the display substrate is attached to the cover plate corresponding to the first region and the plurality of side cover plate regions.

6. The display panel according to claim 5, wherein the display substrate comprises a first display region and a second display region surrounding an outer periphery of the first display region, the first display region is corresponding to the first region, the second display region comprises a plurality of side display regions, the plurality of side display regions are corresponding to the plurality of side cover plate regions of the second region respectively.

7. The display panel according to claim 6, wherein a spacing region corresponding to the corner opening region is located between two adjacent side display regions.

8. The display panel according to claim 6, wherein
the display substrate comprises a round corner;
a first virtual intersection line is perpendicular to a first plane parallel to the first region, and an orthographic projection of the first virtual intersection line on the first plane parallel to the first region is a first intersection point, the first virtual intersection line is formed by an intersection of two adjacent virtual side surfaces of the first region;
two side cover plate regions corresponding to the first intersection point comprises two adjacent virtual side end surfaces respectively, and an orthographic projection of a second virtual intersection line on the first plane is a second intersection point, the second virtual intersection line is formed by an intersection of two planes where the two adjacent virtual side end surfaces are located respectively; and
a contour line of the round corner extends from one of two side display regions corresponding to the first intersection point to the other one of the two side display regions, and an intersection point of the contour line of the round corner and a connecting line between the first intersection point and the second intersection point is a third intersection point.

9. The display panel according to claim 8, wherein the third intersection point is a corner point of the first display region, when the corner point of the first display region coincides with the first intersection point, the third intersection point coincides with the first intersection point.

10. A display terminal comprising:
a middle frame; and
the display panel according to claim 5, wherein the display panel is disposed on the middle frame, and the display panel comprises the cover plate.

11. The display terminal according to claim 10, wherein the buffer portion is protruded from a surface of the middle frame facing to the cover plate.

12. The display terminal according to claim 11, wherein the buffer portion is formed separately from the middle frame, and the buffer portion is embedded in the corner opening region and abuts against the middle frame in a sealing way.

13. The display terminal according to claim 11, wherein a notch communicating with the corner opening region is formed at a corner of the middle frame, and the corner opening region and the notch are filled with the buffer portion.

14. The display terminal according to claim 13, wherein the buffer portion is formed separately from the middle frame, and the buffer portion is bonded to an inner wall of the corner opening region and/or an inner wall of the notch through at least one bonding layer.

15. The display terminal according to claim 13, wherein the buffer portion is formed separately from the middle frame, and the buffer portion is fixed in the corner opening region and/or the notch by at least one fastener.

16. The display panel according to claim 6, wherein edges of the display substrate corresponding to two adjacent side display regions after being bent extend away from each other in a direction away from a plane where the first region is located.

17. A cover plate comprising:
a first region;
a second region surrounding the first region, the second region comprising:
a plurality of side cover plate regions; and
at least one corner opening region located between two adjacent side cover plate regions; and
at least one buffer portion, wherein the buffer portion is filled in the corner opening region;
wherein an orthographic projection of a first virtual intersection line on a first plane parallel to the first region is a first intersection point, the first virtual intersection line is formed by an intersection of two adjacent virtual side surfaces of the first region;
two side cover plate regions corresponding to the first intersection point comprise two adjacent virtual side end surfaces respectively, and an orthographic projection of a second virtual intersection line on the first plane is a second intersection point, the second virtual intersection line is formed by an intersection of two planes where the two adjacent virtual side end surfaces are located respectively; and
wherein the second intersection point is located in the first region.

18. The cover plate according to claim 17, wherein the first region is a flat region, the second region is a curved region, the curved region is located at an edge of the flat region, and the curved region extends from the flat region.

19. The cover plate according to claim 17, wherein the buffer portion is a silicone member.

20. A display panel, comprising:
a display substrate; and
a cover plate, wherein cover plate comprises:
a first region;
a second region surrounding the first region, the second region comprising:
a plurality of side cover plate regions; and
at least one corner opening region located between two adjacent side cover plate regions; and
at least one buffer portion, wherein the buffer portion is filled in the corner opening region,
wherein the display substrate is attached to the cover plate corresponding to the first region and the plurality of side cover plate regions;
wherein the display substrate comprises a first display region and a second display region surrounding an outer periphery of the first display region, the first display region is corresponding to the first region, the second display region comprises a plurality of side display regions, the plurality of side display regions are corresponding to the plurality of side cover plate regions of the second region respectively,
wherein the display substrate comprises a round corner;
a first virtual intersection line is perpendicular to a first plane parallel to the first region, and an orthographic projection of the first virtual intersection line on the first plane parallel to the first region is a first intersection point, the first virtual intersection line is formed by an intersection of two adjacent virtual side surfaces of the first region;

two side cover plate regions corresponding to the first intersection point comprises two adjacent virtual side end surfaces respectively, and an orthographic projection of a second virtual intersection line on the first plane is a second intersection point, the second virtual intersection line is formed by an intersection of two planes where the two adjacent virtual side end surfaces are located respectively; and a contour line of the round corner extends from one of two side display regions corresponding to the first intersection point to the other one of the two side display regions, and an intersection point of the contour line of the round corner and a connecting line between the first intersection point and the second intersection point is a third intersection point.

\* \* \* \* \*